(12) United States Patent
Zelner et al.

(10) Patent No.: US 10,825,612 B2
(45) Date of Patent: Nov. 3, 2020

(54) TUNABLE COPLANAR CAPACITOR WITH VERTICAL TUNING AND LATERAL RF PATH AND METHODS FOR MANUFACTURING THEREOF

(71) Applicant: NXP USA, Inc., Austin, TX (US)

(72) Inventors: Marina Zelner, Burlington (CA); Andrew Vladimir Claude Cervin, Oakville (CA)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/409,188

(22) Filed: May 10, 2019

(65) Prior Publication Data
US 2019/0272956 A1    Sep. 5, 2019

Related U.S. Application Data

(62) Division of application No. 15/791,176, filed on Oct. 23, 2017, now Pat. No. 10,332,687.

(51) Int. Cl.
*H01L 21/00*   (2006.01)
*H01G 7/06*   (2006.01)
(Continued)

(52) U.S. Cl.
CPC .............. *H01G 7/06* (2013.01); *H01G 4/1227* (2013.01); *H01G 4/1236* (2013.01);
(Continued)

(58) Field of Classification Search
CPC ...... H01G 7/06; H01G 4/1227; H01G 4/1236; H01G 4/1254; H01G 9/0029; H01G 4/33;
(Continued)

(56) References Cited

U.S. PATENT DOCUMENTS 5,745,335 A    4/1998  Watt
5,959,516 A    9/1999  Chang et al.
(Continued)

FOREIGN PATENT DOCUMENTS

CA    2219945 A1    2/1997
CA    2419137 A1    3/2002
(Continued)

OTHER PUBLICATIONS

Extended European search report, 18202148.5, dated Apr. 9, 2019, 9 pages.
(Continued)

*Primary Examiner* — Richard A Booth

(57) ABSTRACT

A tunable capacitor that incorporates teachings of the subject disclosure may include: a substrate; a first dielectric layer over the substrate; a plurality of bias lines encapsulated between the substrate and the tunable dielectric layer; a first metal layer over the tunable dielectric layer (wherein the first metal layer has a plurality of first gaps); an upper bias layer over the first metal layer (herein each of a plurality of portions of the upper bias layer extend through a respective one of the plurality of first gaps to come into contact with the first dielectric layer, and wherein at least a second gap is disposed in the upper bias layer); and a second metal layer (wherein a portion of the second metal layer extends through the second gap to come into contact with the first metal layer). Other embodiments are disclosed.

20 Claims, 13 Drawing Sheets

(51) Int. Cl.
*H01G 9/00* (2006.01)
*H01G 4/12* (2006.01)
*H01L 23/522* (2006.01)
*H01L 49/02* (2006.01)
*H01L 21/306* (2006.01)
*H01G 4/33* (2006.01)

(52) U.S. Cl.
CPC ......... *H01G 4/1254* (2013.01); *H01G 9/0029* (2013.01); *H01L 23/5223* (2013.01); *H01L 28/56* (2013.01); *H01L 28/75* (2013.01); *H01L 28/92* (2013.01); *H01G 4/33* (2013.01); *H01L 21/306* (2013.01); *H01L 28/40* (2013.01)

(58) Field of Classification Search
CPC ..... H01L 23/5223; H01L 28/56; H01L 28/75; H01L 28/92; H01L 21/306; H01L 28/40
See application file for complete search history.

(56) References Cited

U.S. PATENT DOCUMENTS

| | | | |
|---|---|---|---|
| 6,066,536 | A | 5/2000 | Lin et al. |
| 6,207,522 | B1 | 3/2001 | Hunt et al. |
| 6,229,684 | B1 | 5/2001 | Cowen et al. |
| 6,347,237 | B1 | 2/2002 | Eden et al. |
| 6,490,147 | B2 | 12/2002 | Yoon et al. |
| 6,556,415 | B1 | 4/2003 | Lee et al. |
| 6,573,587 | B1 | 6/2003 | Igarashi |
| 6,590,473 | B1 | 7/2003 | Seo et al. |
| 6,600,644 | B1 | 7/2003 | Chiou et al. |
| 6,633,260 | B2 | 10/2003 | Paschen et al. |
| 6,744,335 | B2 | 6/2004 | Ryhänen et al. |
| 6,800,912 | B2 | 10/2004 | Ozgur et al. |
| 6,815,739 | B2 | 11/2004 | Huff et al. |
| 6,876,056 | B2 | 4/2005 | Tilmans et al. |
| 6,906,905 | B1 | 6/2005 | Chinthakindi et al. |
| 6,922,327 | B2 | 7/2005 | Chua et al. |
| 6,954,348 | B1 | 10/2005 | Rodgers et al. |
| 6,970,055 | B2 | 11/2005 | Toncich et al. |
| 6,992,878 | B2 | 1/2006 | Shimanouchi et al. |
| 7,030,463 | B1 | 4/2006 | Subramanyam et al. |
| 7,085,122 | B2 | 8/2006 | Wu et al. |
| 7,224,040 | B2 | 5/2007 | Koutsaroff et al. |
| 7,265,019 | B2 | 9/2007 | Chinthakindi et al. |
| 7,738,237 | B2 | 6/2010 | Lee |
| 7,749,792 | B2 | 7/2010 | Fedder et al. |
| 7,858,423 | B2 | 12/2010 | Siamak et al. |
| 7,869,187 | B2 | 1/2011 | McKinzie et al. |
| 8,072,272 | B2 | 12/2011 | Zhao et al. |
| 8,154,850 | B2 | 4/2012 | Zelner et al. |
| 8,194,386 | B2 | 6/2012 | Steeneken et al. |
| 8,424,176 | B2 | 4/2013 | Smith et al. |
| 8,569,142 | B2 | 10/2013 | Patel Atin et al. |
| 8,664,704 | B2 | 3/2014 | Cervin et al. |
| 8,693,162 | B2 | 4/2014 | Capanu et al. |
| 9,269,496 | B2 | 2/2016 | Oakes |
| 9,438,196 | B2 | 9/2016 | Smith |
| 9,773,781 | B1 | 9/2017 | Zang et al. |
| 2003/0011002 | A1 | 1/2003 | Takaura et al. |
| 2003/0104649 | A1 | 6/2003 | Ozgur et al. |
| 2005/0117439 | A1 | 6/2005 | Kijima |
| 2005/0227428 | A1 | 10/2005 | Mihai et al. |
| 2006/0263974 | A1 | 11/2006 | Busch et al. |
| 2007/0007853 | A1* | 1/2007 | Toit .......................... H01G 7/06 310/315 |
| 2007/0132065 | A1 | 6/2007 | Lee et al. |
| 2009/0275187 | A1 | 11/2009 | Kiehlbauch et al. |
| 2010/0182730 | A1 | 7/2010 | Beelen et al. |
| 2010/0182731 | A1* | 7/2010 | Steeneken ............ H01G 5/0136 361/281 |
| 2013/0342285 | A1* | 12/2013 | Kadota .................. H03H 9/542 333/188 |
| 2014/0216921 | A1 | 8/2014 | Zelner et al. |
| 2016/0268048 | A1 | 9/2016 | Zelner |
| 2019/0080851 | A1* | 3/2019 | Nies ...................... H01G 4/012 |
| 2019/0122826 | A1 | 4/2019 | Zelner et al. |
| 2019/0123131 | A1 | 4/2019 | Cervin et al. |
| 2020/0066836 | A1 | 2/2020 | Cervin et al. |

FOREIGN PATENT DOCUMENTS

| | | |
|---|---|---|
| CA | 2422007 A1 | 3/2002 |
| CA | 2422040 A1 | 3/2002 |
| EP | 0837504 A2 | 4/1998 |
| EP | 1682444 A2 | 7/2006 |
| EP | 1717830 B1 | 6/2010 |
| EP | 2096650 A4 | 12/2013 |
| EP | 2768072 A1 | 8/2014 |
| EP | 1836712 B1 | 10/2014 |
| WO | 0184660 A1 | 11/2001 |
| WO | 02/084684 A2 | 10/2002 |
| WO | 02084684 A2 | 10/2002 |
| WO | 2005001863 A1 | 1/2005 |
| WO | 2005/043573 A2 | 5/2005 |
| WO | 2008050271 A2 | 5/2008 |
| WO | 2017099737 A1 | 6/2017 |

OTHER PUBLICATIONS

Arif, Muhammad S. et al., "All-Silicon Technology for High-Q Evanescent Mode Cavity Tunable Resonators and Filters", Microelectromechanical Systems 23.3, 2014, 727-739.

Chang, "Design, optimization and fabrication of amorphous silicon tunable RF MEMS inductors and transformers", A thesis presented to the University of Waterloo in fulfillment of the thesis requirement for the degree of Doctor of Philosophy in Electrical and Computer Engineering, 2006, 1-178.

Chen, et al., "Design and modeling of a micromachined high-Q tunable capacitor with large tuning range and a vertical planar spiral inductor", IEEE Transactions on Electron Devices 50.3, Apr. 2003, 730-739.

Fritschi, Raphael, "Above-IC RF MEMS devices for communication applications", 2007, pp. 1-191.

Mesgar, Alireza H., "Design, fabrication and characterization of RF MEMS inductors and switches", Diss. Concordia University, 2006, pp. 1-168.

Oberhammer, J. et al., "Monocrystalline-Silicon Microwave MEMS", PIERS Progress in Electromagnetics Research Symposium, Stockholm, Sweden, Aug. 12-15, 2013. The Electromagnetics Academy, 2013, pp. 1-7.

Vega, Reinaldo, "Advanced source/drain and contact design for nanoscale CMOS", University of California, Berkeley, 2010, pp. 1-144.

Yeh, J. A. et al., "Microwave characteristics of liquid-crystal tunable capacitors", IEEE Electron Device Letters 26.7, 2005, 451-453.

Yoon, Yong-Kyu et al., "A Reduced Intermodulation Distortion Tunable Ferroelectric Capacitor: Architecture and Demonstration", School of Electrical and Computer Engineering, Georgia Institute of Technology, Atlanta, GA 30332, USA, 2003, 4 pages.

Zou, Jun et al., "Micromachined inductors and capacitors", Grainger Center for Electric Machinery and Electromechanics. Technical Report., Mar. 2003, 1-31.

* cited by examiner

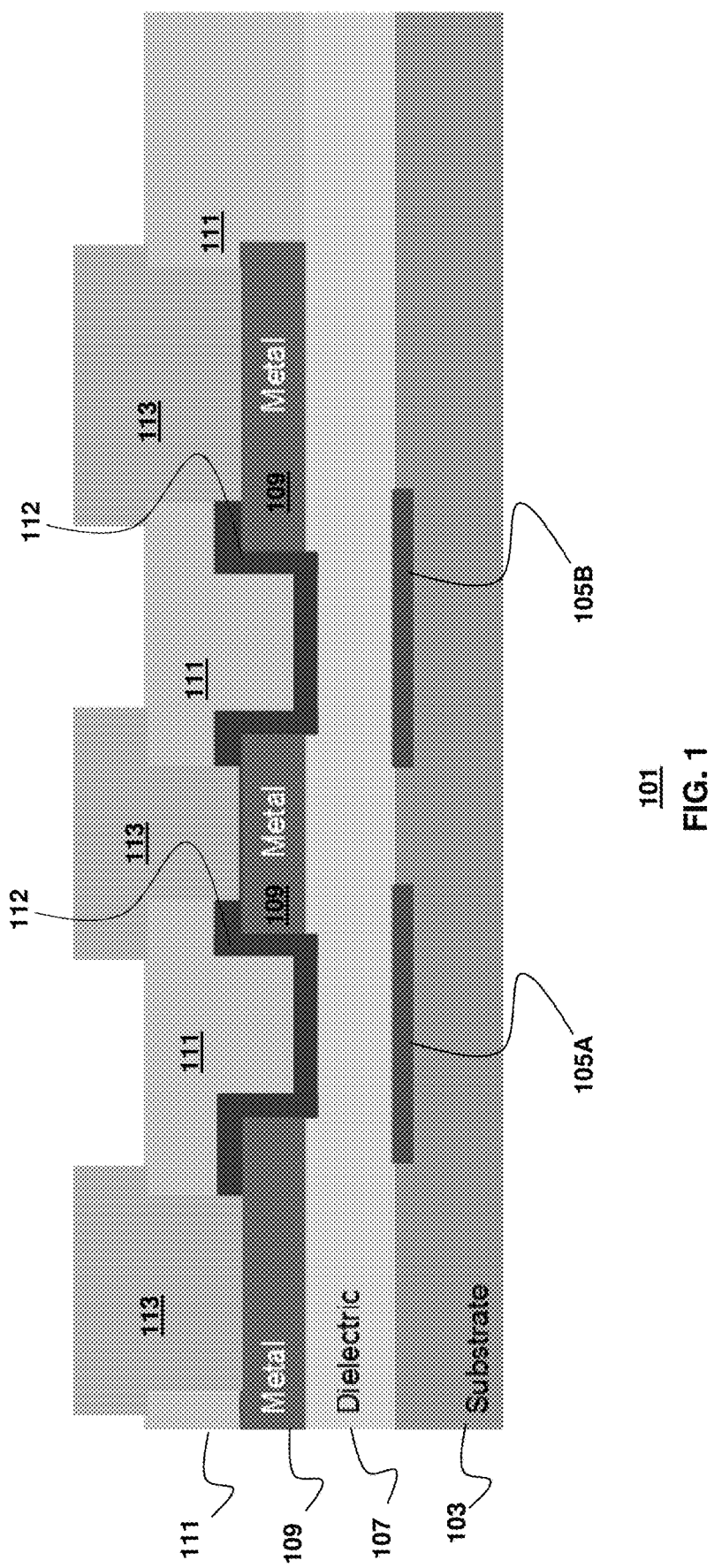

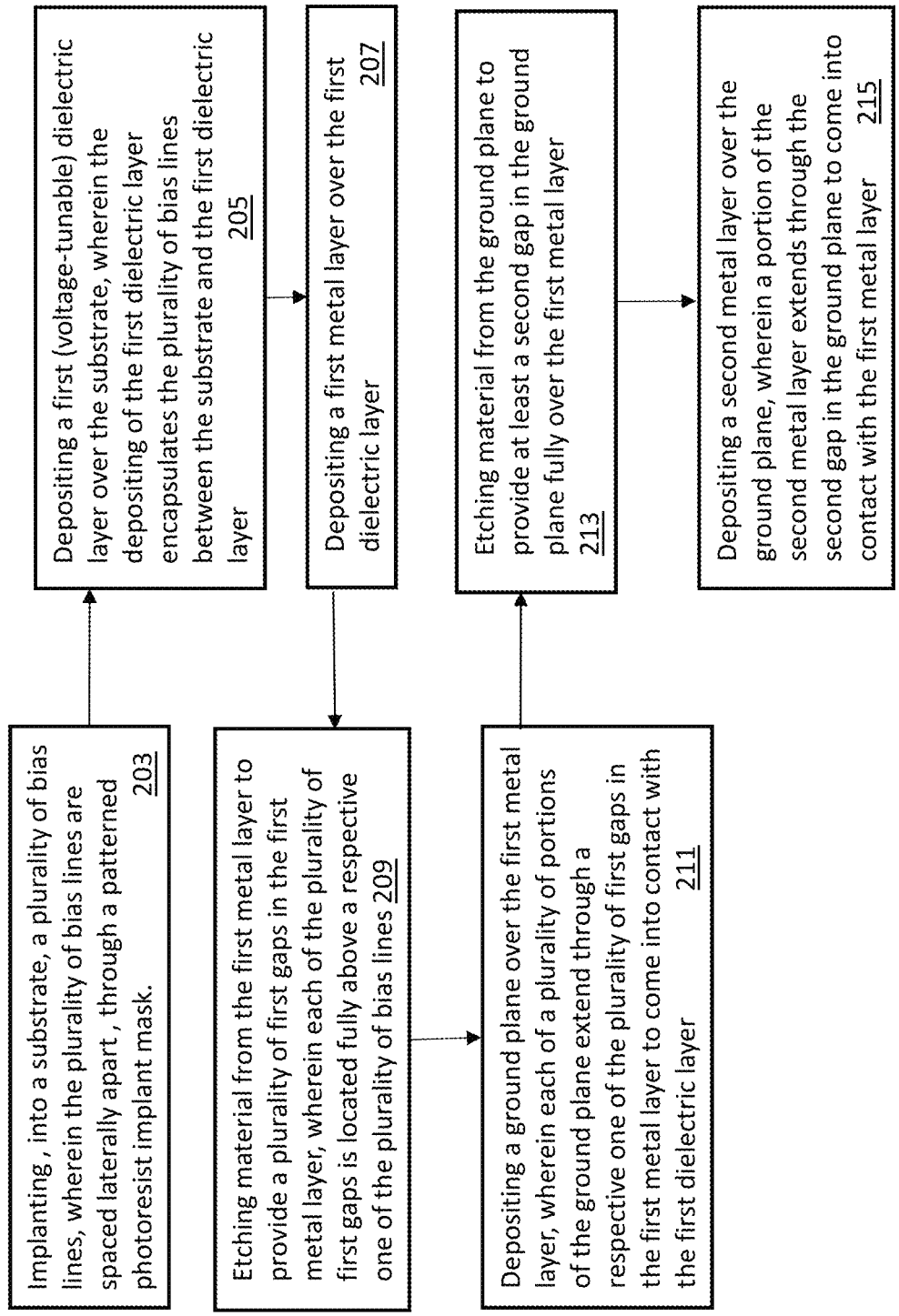

501

TUNABLE COPLANAR CAPACITOR WITH VERTICAL TUNING AND LATERAL RF PATH AND METHODS FOR MANUFACTURING THEREOF

CROSS-REFERENCE TO RELATED APPLICATION(S)

This application is a divisional of U.S. patent application Ser. No. 15/791,176, filed on Oct. 23, 2017. All sections of the aforementioned application(s) and patent(s) are incorporated herein by reference in their entirety.

The subject disclosure relates to U.S. patent application Ser. No. 15/791,177, filed on Oct. 23, 2017 entitled SMALL-GAP COPLANAR TUNABLE CAPACITORS AND METHODS FOR MANUFACTURING THEREOF, in the name of Andrew Vladimir Claude Cervin, et al., the disclosure of which is hereby incorporated by reference.

FIELD OF THE DISCLOSURE

The subject disclosure relates, in general, to tunable coplanar capacitors and, more particularly, to a tunable coplanar capacitor with vertical tuning and lateral RF path and methods for manufacturing thereof.

BACKGROUND

Tunable capacitors have various uses in RF systems including as voltage-tunable devices. Some benefits of tunable capacitors are integration of different values and functions of capacitance. Applications for tunable capacitors can include tunable filters, voltage controlled oscillators, tunable phase shifters, tunable matching networks, low-impedance power supplies, decoupling high-frequency signals at an IC bonding pad, or others.

Integrated circuits including tunable capacitors can, for example, be used in portable electronics for low-power wireless communication (e.g., cellular phones, pagers, PDAs, and so forth), directional antenna systems, high clock-rate microphones, miniature DC to DC converters, or other devices.

Conventional coplanar tunable capacitors are not easily used in consumer electronics because the spacing of the RF electrodes typically requires a very high tuning voltage to attain the electric field across the gap to realize any useful tuning range for the capacitor. These voltages, up to 100V or 200V cannot be easily generated in mobile equipment and low-cost applications.

BRIEF DESCRIPTION OF THE DRAWINGS

Reference will now be made to the accompanying drawings, which are not necessarily drawn to scale, and wherein:

FIG. 1 depicts an illustrative embodiment of a tunable coplanar capacitor (this view provides a cross-sectional diagram);

FIG. 2A depicts an illustrative embodiment of a method that can be used for manufacturing of a tunable coplanar capacitor;

DETAILED DESCRIPTION

Figure 2B:
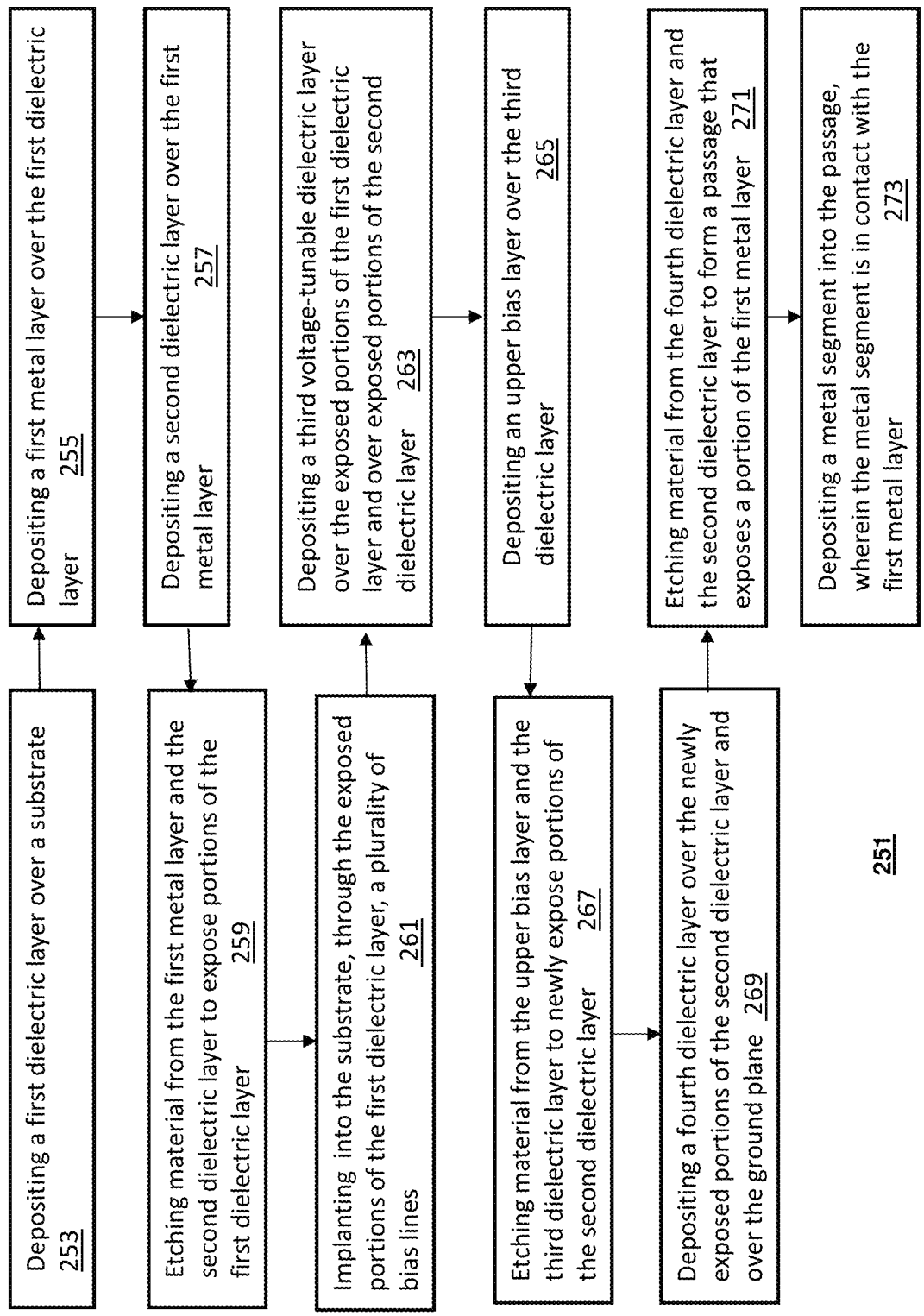
FIG. 2B depicts an illustrative embodiment of a method that can be used for manufacturing of a tunable coplanar capacitor.

The subject disclosure describes, among other things, illustrative embodiments of coplanar tunable capacitors and methods for manufacturing thereof. Other embodiments are described by the subject disclosure.

One embodiment of the subject disclosure includes a tunable capacitor, comprising: a substrate; selective implant of dopants to form a plurality of bottom bias lines, wherein the plurality of bottom bias lines are spaced laterally apart; a voltage tunable dielectric layer deposited over the substrate; with the voltage tunable dielectric layer encapsulating the plurality of bottom bias lines; a first metal layer over the voltage-tunable dielectric layer, wherein a plurality of first gaps are disposed in the first metal layer forming RF electrodes from the remaining portions of the first metal layer, and wherein each of the plurality of first gaps is located at least partially above a respective one of the plurality of bias lines; an upper bias layer over the first metal layer, wherein each of a plurality of portions of the upper bias layer extend through a respective one of the plurality of first gaps in the first metal layer to come into contact with the tunable dielectric layer forming the RF electrodes, and wherein at least a second gap is disposed in the upper bias layer; and a second metal layer, wherein a portion of the second metal layer extends through the second gap in the upper bias layer to come into contact with the first metal layer. In various embodiments, the capacitor can be made with or without an inter-layer dielectric (ILD) layer on top of the RF electrodes.

Another embodiment of the subject disclosure includes a method for fabricating a tunable capacitor, the method comprising depositing a tunable dielectric layer over the substrate; depositing a first metal layer over the tunable dielectric layer; depositing a first inter-layer dielectric (ILD) layer over the first metal layer; etching material from the first ILD layer and first metal layer to provide a plurality of first gaps in the first metal layer forming the RF electrodes from the remaining portions of the first metal layer; implanting dopant atoms into the substrate through the exposed portions of the tunable dielectric layer forming a plurality of bottom bias lines, wherein the bottom bias lines are self-aligned to the gaps in the first metal layer (and wherein the tunable dielectric layer encapsulates the plurality of bottom bias lines between the substrate and the tunable dielectric layer); depositing an upper bias layer over the first metal layer, wherein each of a plurality of portions of the upper bias layer extend through a respective one of the plurality of first gaps in the first metal layer to come into contact with the tunable dielectric layer; etching material from the upper bias layer to provide at least a second gap in the upper bias layer; and depositing a second metal layer over the upper bias layer providing desired interconnect wherein a portion of the second metal layer extends through the second gap in the upper bias layer to come into contact with the first metal layer. As described herein, such a self-aligned version of the bottom bias lines can minimize the device size and minimize parasitic capacitances (in various specific examples, the tunable dielectric can be repaired and the dopants activated). Again, in various embodiments, the capacitor can be made with or without an inter-layer dielectric (ILD) layer on top of the RF electrodes.

Another embodiment of the subject disclosure includes a method for fabricating a tunable capacitor, the method comprising: depositing a first voltage-tunable dielectric layer over a substrate; depositing a first metal layer over the first dielectric layer; depositing a first ILD over the first metal layer; etching material from the first ILD layer and the first metal layer to expose portions of the first voltage-tunable dielectric layer and form the RF electrodes from the remaining portions of the first metal layer, ion implanting dopants into the substrate, through the exposed portions of the tunable dielectric layer to form a plurality of bottom bias lines that are self-aligned to the RF electrodes, wherein the plurality of bottom bias lines are spaced laterally apart, and wherein the plurality of bias lines is encapsulated by the first dielectric layer; depositing a second voltage-tunable dielectric layer over the exposed portions of the first dielectric layer and over exposed portions of the ILD; depositing an upper bias layer over the second layer of tunable dielectric; etching material from the upper bias layer and the second voltage-tunable dielectric layer to newly expose portions of the ILD; depositing a second ILD layer over the newly exposed portions of the ILD and over the upper bias layer; etching material from the first and second ILD layers to form a passage that exposes a portion of the RF electrode; and depositing a metal segment into the passage, wherein the medal segment is in contact with the RF electrode.

As described herein, various embodiments separate the tuning of the capacitor from the gap between the RF electrodes by using a buried bias line to generate a DC tuning electric field perpendicular to the RF electric field. This allows independent optimization of the RF and DC tuning parameters for a high-performance and low-cost device.

As described herein, the term "implanting" includes the process of ion implant that is widely used in the semiconductor industry to inject dopants (controlled impurity) into semiconductors (typically silicon). The amount of dopant and the depth to which they are implanted are precisely controlled by the process conditions. Dopants can be implanted deep into the silicon or through thick oxides by using higher acceleration voltages. The implanted dopants cause a change in the conductivity and possibly the carrier type (N-type or P-type). In the current invention, such change enables conversion of the semiconducting material of Si substrate into the resistive lower biasing electrode. The resistance of the lower biasing layer is controlled by the implanted dose and by the following thermal activation. Ion implant technology is well-established in the silicon-based semiconductor industry and is often used in silicon technology. Selected areas of silicon are implanted with an implant mask of photoresist, oxide or other materials.

Referring now to FIG. 1, a tunable capacitor device 101 according to an embodiment is shown (this FIG. 1 shows the device 101 in cross section). Device 101 comprises substrate 103. A layer of voltage tunable material 107 is disposed over the substrate. The voltage tunable material can be any voltage tunable dielectric. For example, it could be (but not limited to) Barium Strontium Titanate (BST), Barium Lanthanum Tantalate (BLT), Lead Titanate (PT), Lead Lanthanum Zirconate Titanate (PLZT), Strontium Bismuth Niobate (SBN), including the doped compositions or multi-layer structures thereof. A plurality of the bottom bias lines 105A, 105B are embedded areas in the substrate under the tunable dielectric layer, wherein the plurality of bottom bias lines are spaced laterally apart (while two bias lines are shown in this view, it is to be understood that any desired number of bias lines may be utilized). In various embodiments, bottom bias lines (that is, implanted areas) can be used for vertical bias of the first dielectric layer.

Still referring to FIG. 1, a first metal layer 109 forming RF electrodes is disposed over the tunable dielectric layer 107 wherein a plurality of the gaps between RF electrodes (the first gaps) are disposed in the first metal layer, and wherein each of the plurality of first gaps is located fully above a respective one of the plurality of bias lines. An upper bias layer 112 (comprising high resistivity electrically conductive material, e.g., SiCr or electrically conductive oxide, e.g. indium-tin-oxide (ITO), Strontium Ruthenium Oxide (SRO), Iridium Oxide, etc) is disposed over the patterned first metal layer, wherein each of a plurality of portions of the upper bias layer extend through a respective one of the plurality of first gaps in the first metal layer to make contact with the first dielectric layer. The upper bias layer 112 is patterned and etched partly exposing RF electrodes 109, wherein each of a plurality of portions of the upper bias layer extend through a respective one of the plurality of the RF electrode portions of the first metal layer to come into contact providing hermetic seal of the underlying tunable dielectric. Still referring to FIG. 1, in one embodiment, a layer 111 of Inter-Layer Dielectric (ILD) is deposited over the patterned upper bias layer and the exposed portions of the RF electrode layer 109. The structure is then patterned and etched in order to form VIAs to RF electrodes 109. A layer of highly conductive metal 113 is deposited over the ILD layer with etched VIAs. At least a portion of the upper bias layer 112 extends through the gap in the upper bias layer to come into contact with the first metal layer (see call out numbers 113). In another example, each of the plurality of first gaps is located at least partially above a respective one of the plurality of bias lines.

Still referring to FIG. 1, in one embodiment a process to fabricate the capacitor device can comprise: (a) substrate (see 103) preparation; (b) a photoresist implant mask followed by a low-dose/low-energy dopant implantation followed by a photoresist strip and thermal activation of the dopants (see 105A, 105B), (c) tunable dielectric layer (see 107) deposition; (d) first metal layer (see 109), e.g., Pt, deposition; (e) tunable dielectric layer pattern; (f) metal layer (RF electrode) pattern; (g) upper bias (ground-) layer (see 112) deposition/pattern; (h) ILD deposition can be done over the whole surface and can form part of the thickness of oxide 111); (i) SiCr resistor (see 112) deposition/pattern; (j) second ILD layer (see 111) deposition; (k) contact pattern/etch; (l) resistor contact pattern/etch; (m) device contact pattern/etch; (n) Metallization (see 113) deposition/pattern; (o) standard passivation (not shown). In one example, the photoresist mask is spun, exposed and developed like conventional photoresist, but the thickness is adjusted to keep the implanted dopant species from getting to the silicon through the mask. One potential difficulty with this approach can be that there is no etching of the silicon with the implant mask so there are no features to align the Pt electrode mask to the implanted bias lines. This potential difficulty can be solved, in one example, by etching of global alignment marks into the silicon at locations on the wafer removed from the chip (such etching of global alignment marks can potentially adversely affect the alignment and can potentially result in the device being bigger).

As described above with reference to FIG. 1 is a vertically-biased lateral RF tunable capacitor (sometimes referred to herein as "VBLRtunable capacitor"). This embodiment utilizes an 8-mask process, including the implant mask (in this regard, there can be a need in certain examples to etch global or local alignment marks with the implant mask). In one specific example, silicon (and/or Silicon-On-Insulator (SOI)/Poly-Si on Insulator) may be used as the substrate for the implant (bias line). In another specific example, the SiCr upper bias layer on top may provide very high resistance (e.g., much higher than the capacitor impedance at the operating frequency). In another specific example, electrode spacing may be determined by capacitance requirements, linearity requirements and/or Q-factor requirements. In another specific example, a contact to the implanted area may be provided.

Referring now to FIG. 2A, various steps of a method 201 (for fabricating a tunable capacitor) according to the embodiment in FIG. 1 are shown. As seen in this FIG. 2A, step 203 comprises implanting, dopant atoms into a silicon substrate or polysilicon layer to form a plurality of bias lines, wherein the plurality of bias lines are spaced laterally apart (and wherein the implanting of the plurality of bias lines is through a patterned photoresist implant mask). Next, step 205 comprises depositing a first (voltage-tunable) dielectric layer over the substrate, wherein the depositing of the first dielectric layer encapsulates the plurality of bias lines underneath the first dielectric layer. Next, step 207 comprises depositing a first metal layer over the first dielectric layer. Next, step 209 comprises etching material from the first metal layer to provide a plurality of first gaps in the first metal layer, wherein each of the plurality of first gaps is located at least partially (e.g., fully) above a respective one of the plurality of bias lines. Next, step 211 comprises depositing an upper bias layer (which may, in some examples, be a ground plane) over the first metal layer, wherein each of a plurality of portions of the upper bias layer extend through a respective one of the plurality of first gaps in the first metal layer to make contact with the first dielectric layer. Next, step 213 comprises etching material from the upper bias layer to provide at least a second gap in the upper bias layer. Next, step 215 comprises depositing a second metal layer over the upper bias layer, wherein a portion of the second metal layer extends through the second gap in the upper bias layer to come into contact with the first metal layer.

Figure 4:
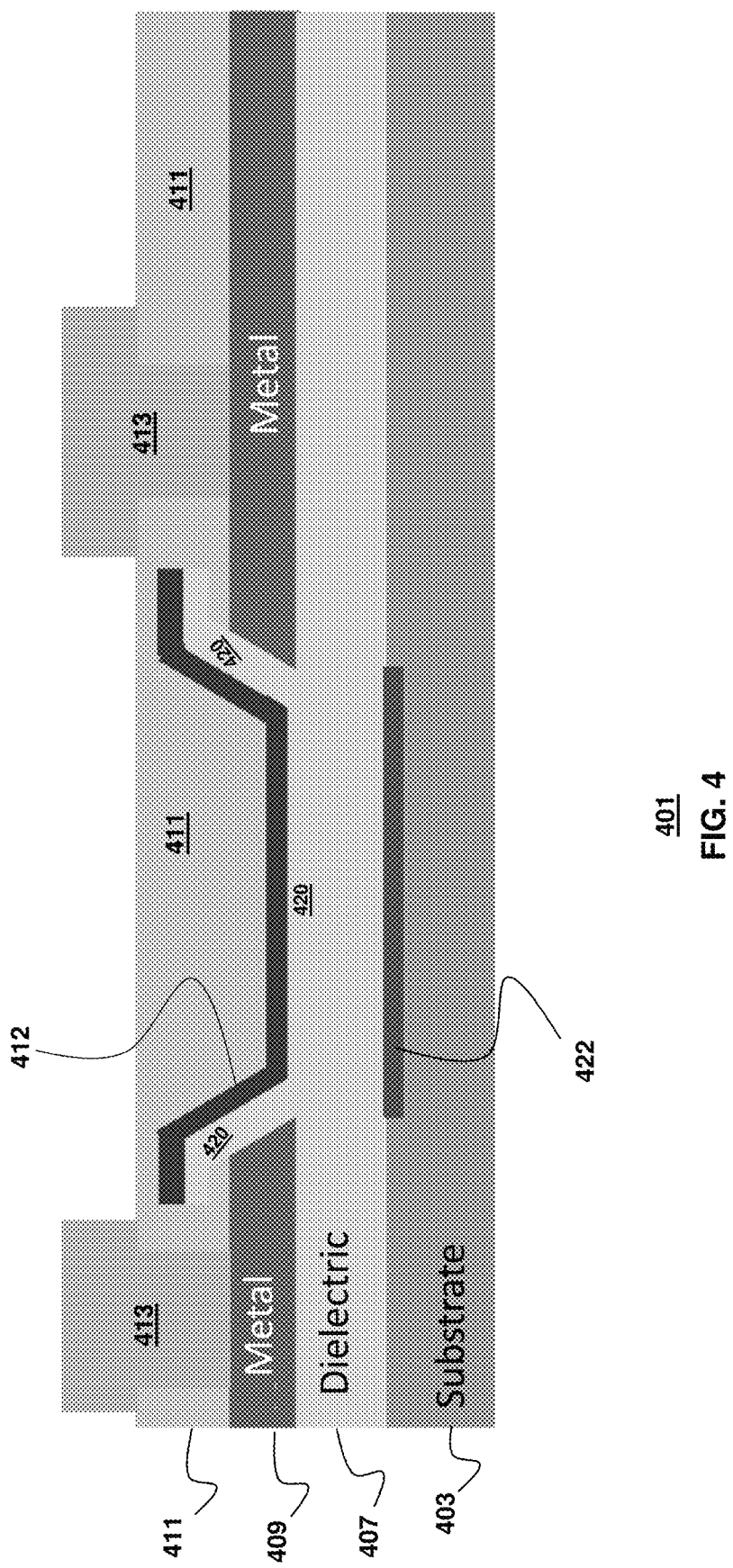
FIG. 4 depicts an illustrative embodiment of a tunable coplanar capacitor (this view provides a cross-sectional diagram)

Referring now to FIG. 2B, various steps of a method 251 (for fabricating a tunable capacitor) according to the embodiment in FIG. 4 are shown. As seen in this FIG. 2B, step 253 comprises depositing a first dielectric layer over a substrate. Next, step 255 comprises depositing a first metal layer over the first dielectric layer. Next, step 257 comprises depositing a second dielectric layer over the first metal layer. Next, step 259 comprises etching material from the second dielectric layer and first metal layer to expose portions of the first dielectric layer, resulting in exposed portions of the first dielectric layer. Next, step 261 comprises implanting dopant atoms into a silicon substrate or polysilicon layer through the exposed portions of the first dielectric layer to form a plurality of bias lines, wherein the plurality of bias lines are spaced laterally apart, and wherein the implanting encapsulates the plurality of bias lines underneath the first dielectric layer. Next, step 263 comprises depositing a third, voltage-tunable, dielectric layer over the exposed portions of the first dielectric layer and over exposed portions of the second dielectric layer. Next, step 265 comprises depositing an upper bias layer (which may, in some examples, be a ground plane) over the third dielectric layer. Next, step 267 comprises etching material from the upper bias layer and the third dielectric layer to newly expose portions of the second dielectric layer. Next, step 269 comprises depositing a fourth dielectric layer over the newly exposed portions of the second dielectric layer and over the upper bias layer. Next, step 271 comprises etching material from the fourth dielectric layer and the second dielectric layer to form a passage that exposes a portion of the first metal layer, resulting in an exposed portion of the first metal layer. Next, step 273 comprises depositing a metal segment into the passage, wherein the metal segment is in contact with the first metal layer. In various embodiments, the second dielectric layer (and/or first ILD layer) may be optional such as, for example, if the resistance of the top bias layer is high enough).

Figure 3:
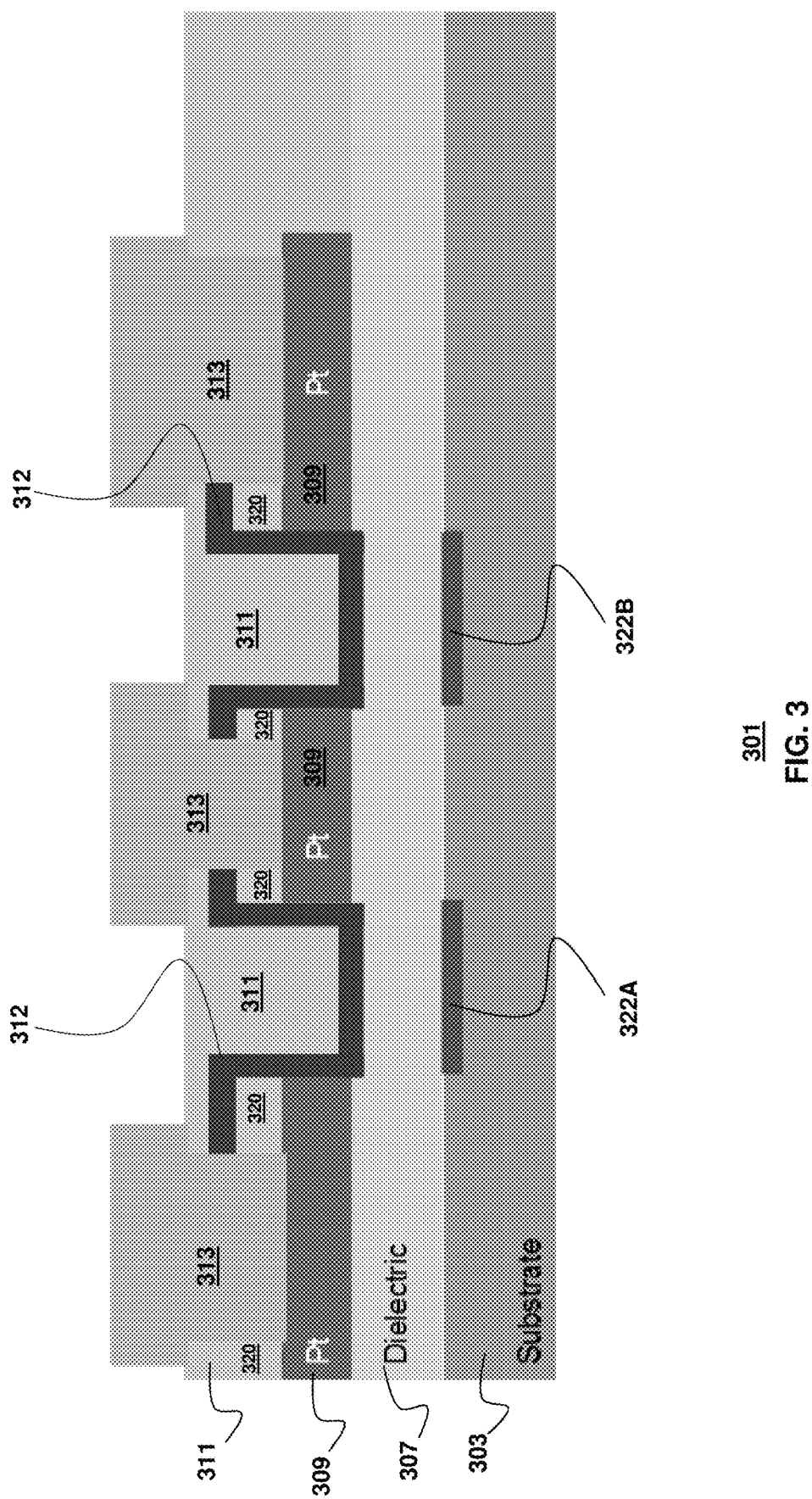
FIG. 3 depicts an illustrative embodiment of a tunable coplanar capacitor (this view provides a cross-sectional diagram)

Referring now to FIG. 3, a tunable capacitor device 301 according to an embodiment is shown (this FIG. 3 shows the device 301 in cross section). Device 301 comprises substrate 303. A layer of voltage tunable material 307 is disposed over the substrate. The voltage tunable material can be any voltage tunable dielectric. For example, it could be (but not limited to) Barium Strontium Titanate (BST), Barium Lanthanum Tantalate (BLT), Lead Titanate (PT), Lead Lanthanum Zirconate Titanate (PLZT), Strontium Bismuth Niobate (SBN), including the doped compositions and/or multi-layer structures thereof. A plurality of bias lines 322A, 322B are encapsulated underneath the first dielectric layer, wherein the plurality of bias lines are spaced laterally apart (while two bias lines are shown in this view, it is to be understood that any desired number of bias lines may be utilized) and are self-aligned to gaps between the RF electrodes (with respect to self-aligned, see the vertical alignment of bias line 322A under the left gap in first metal layer 309 and the vertical alignment of bias line 322B under the right gap in first metal layer 309). In various embodiments, these bias lines (that is, implanted areas) can be used for vertical bias of the first dielectric layer.

Still referring to FIG. 3, a first metal layer 309 forming RF electrodes is disposed over the tunable dielectric layer 307 wherein a plurality of the gaps between RF electrodes (the first gaps) are disposed in the first metal layer, and wherein each of the plurality of first gaps is located fully (self-aligned) above a respective one of the plurality of bias lines. An upper bias layer 312 (comprising high resistivity electrically conductive material, e.g., SiCr or electrically conductive oxide, e.g. indium-tin-oxide (ITO), Strontium Ruthenium Oxide (SRO), Iridium Oxide, etc) is disposed over the patterned first metal layer, wherein each of a plurality of portions of the upper bias layer extend through a respective one of the plurality of first gaps in the first metal layer to make contact with the first dielectric layer. In addition, at least one gap is disposed in the upper bias layer. A second metal layer is provided such that at least a portion of the second metal layer extends through the gap in the upper bias layer to make contact with the first metal layer (see call out numbers 313). In another example, each of the plurality of first gaps is located at least partially above a respective one of the plurality of bias lines Still referring to FIG. 3, in one embodiment, an ILD layer 320 (e.g., comprising $SiO_2$) is disposed between the upper bias layer and the first metal layer. In one specific example, the second dielectric layer has at least one gap located at least partially under the gap in the upper bias layer and wherein the portion of the second metal layer extends through the gap in the second dielectric layer and extends through the gap in the ground plan to come into contact with the first metal layer.

Still referring to FIG. 3, in one embodiment a process to fabricate the capacitor device can comprise: (a) first dielectric layer (see 307) deposition; (b) first metal layer (see 309), e.g., Pt, deposition; (c) first inter-level dielectric (ILD) oxide (see 320) deposition; (d) first dielectric layer pattern; (e) first metal layer (e.g., electrode) pattern; (f) high-voltage implant (see 322A, 322B); (g) high-temperature anneal; (h) upper bias layer (see 312) deposition/pattern; (i (j) upper bias layer (see 312) deposition/pattern; (k) second inter-layer dielectric (ILD) deposition (see 311); ((n) device contact pattern/etch; (o) Metallization/deposition/pattern; (p) standard passivation. In one example, the high-voltage implant (to put the dopant atoms deeper into the substrate (e.g., through the layer of tunable dielectric and into the substrate)) can be in the range of 150 to 500 KV (normal implant voltages are typically in the range of 20-50 KV).

As described above with reference to FIG. 3 is a self-aligned vertical bias/lateral RF voltage-tunable capacitor. In this embodiment, the buried implanted layer is self-aligned to the electrodes. In one example, each implant is done at high energy after the top oxide and electrodes are patterned. In one specific example, each implant will be very low dose to give high resistance for the buried bias layer. In various examples, a high implant dose can be in the range of 10e14 to 10e15 atoms/sq cm; a medium dose can be in the range of 1e12 to 1e14 atoms/sq cm; and a low dose can be in the range of 1e10 to 1e12 atoms/sq cm. It is, in one example, this low dose range that can be used to get high resistance bias lines (less dopant=higher resistance). A contact to the buried implant can be provided for biasing. In various examples, one or more of a silicon wafer, a polysilicon layer on top of an insulating substrate, SOI or SOS could be used. In one specific example, the same SiCr can be used for the upper bias layer and the resistors (the metal (e.g., Pt) would need to be, in some embodiments, removed from under the SiCr resistors). In one embodiment, electrode contact etch can go through the SiCr upper bias layer.

Referring now to FIG. 4, a tunable capacitor device 401 according to an embodiment is shown (this FIG. 4 shows the device 401 in cross section). Device 401 (which utilizes an isolated upper bias layer) comprises substrate 403. A first dielectric layer 407 is disposed over the substrate. In one specific example, the first dielectric layer can be Barium Strontium Titanate. In another specific example, the voltage-tunable material can have a dielectric constant that can be varied by application of a voltage. A bias line 422 is encapsulated between the substrate and the first dielectric layer (while one bias line is shown in this view, it is to be understood that any desired number of bias lines may be utilized). In various embodiments, these bias lines (that is, implanted areas) can be used for vertical bias of the tunable dielectric layers.

Still referring to FIG. 4, a first metal layer 409 is disposed over the first dielectric layer. The top dielectric layer (see 411) is disposed over an upper bias layer 412. In addition, a second metal layer is provided such that at least a portion of the second metal layer extends to make contact with the first metal layer (see call out numbers 413).

Still referring to FIG. 4, in the variation of this embodiment, the device has an additional high-temperature BST (or other voltage-tunable dielectric) layer (see 420) deposited after the etching of the second dielectric layer and the metal layer (see 409) and implanting the bias lines (see 422). This additional layer (see 420) then insulates the resistive ground electrode from the RF electrodes and removes any DC leakage path between the RF electrodes.

Still referring to FIG. 4, the fabrication process sequence is generally the same as previously described but uses an additional step to deposit the additional high quality, voltage-tunable (e.g., BST) dielectric layer before the deposition of the upper bias layer. In one specific example, there may be additional annealing steps applied. In another specific example, the second voltage-tunable dielectric is deposited by a conformal technique such as sputtering, metal organic chemical vapor deposition (MOCVD) or vapor-deposited metal organic deposition (MOD) solution.

In yet another variation, very thin sidewall spacers could be used to provide the separation of upper bias layer and RF electrodes.

In another embodiment, the upper bias layer can be one or more of SiCr, ITO (indium-tin-oxide) but it must be of high resistivity.

Figure 5:
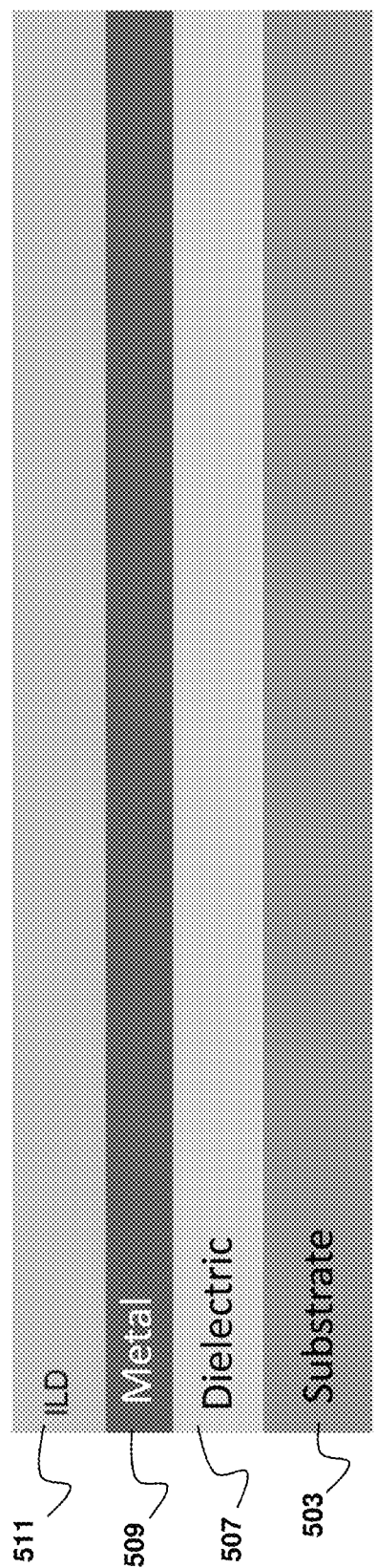
FIGS. 5-10 depict an illustrative embodiment of various steps in the manufacturing of a tunable coplanar capacitor (these views provide cross-sectional diagrams)

Referring now to FIGS. 5-10, depicted is an illustrative embodiment of various steps in the manufacturing of a tunable coplanar capacitor (in FIGS. 5-10, each call out number refers to the same respective component (as modified throughout the process) that is shown in each of the figures of this series). More particularly, FIG. 5 depicts the results of substrate preparation (see substrate 503). Still referring to FIG. 5, it is seen that dielectric layer 507 is deposited on substrate 503; that metal layer 509 is deposited on the dielectric layer; and that inter-level dielectric (ILD) layer (see 511) is deposited on the metal layer. In various embodiments, one or more implanted areas (see 522A, 522B of FIGS. 6-10) in the substrate can be used for vertical bias of the dielectric layer 507.

Figure 6:
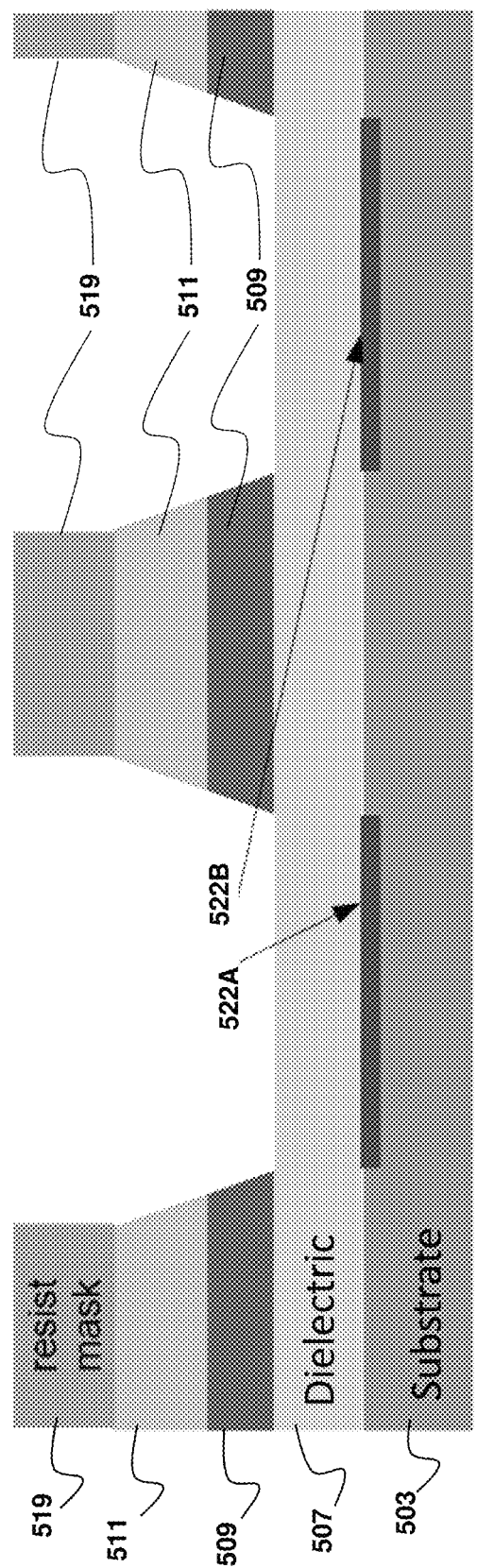

Further, FIG. 6 depicts the results of: (a) electrode patterning/etch; and (b) bias and contact implants. In this FIG. 6, the contact implant is not shown (the contact implant is defined, in this example, by a separate photoresist mask). This FIG. 6 also shows resist (e.g., photoresist) mask 519 used in part to mask the bias line implant.

Figure 7:
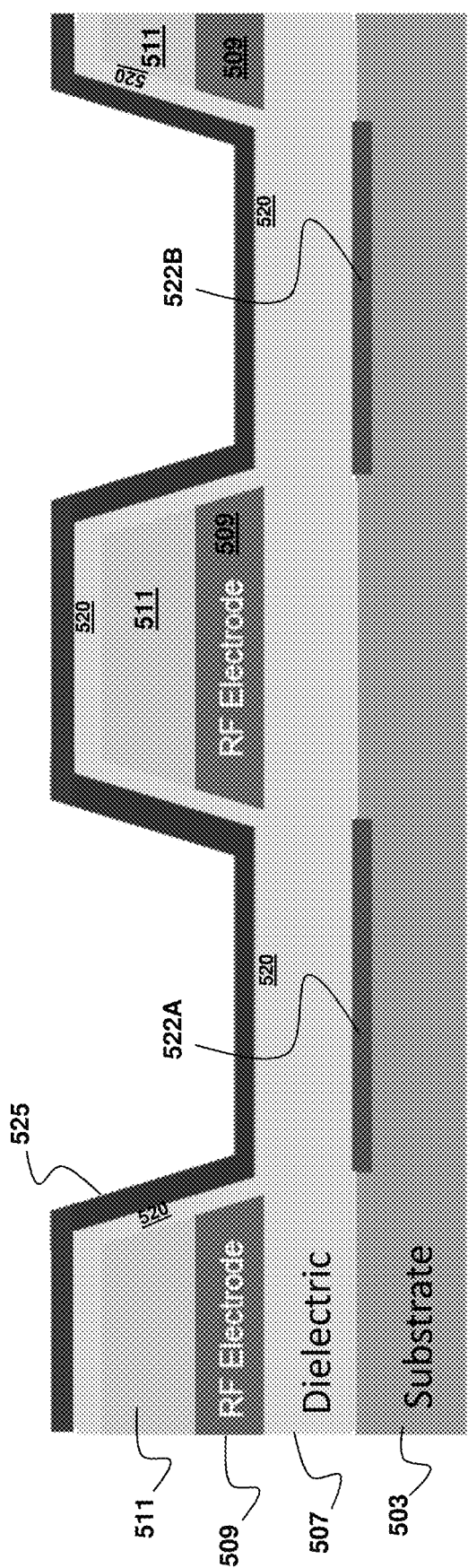
Figure 8:
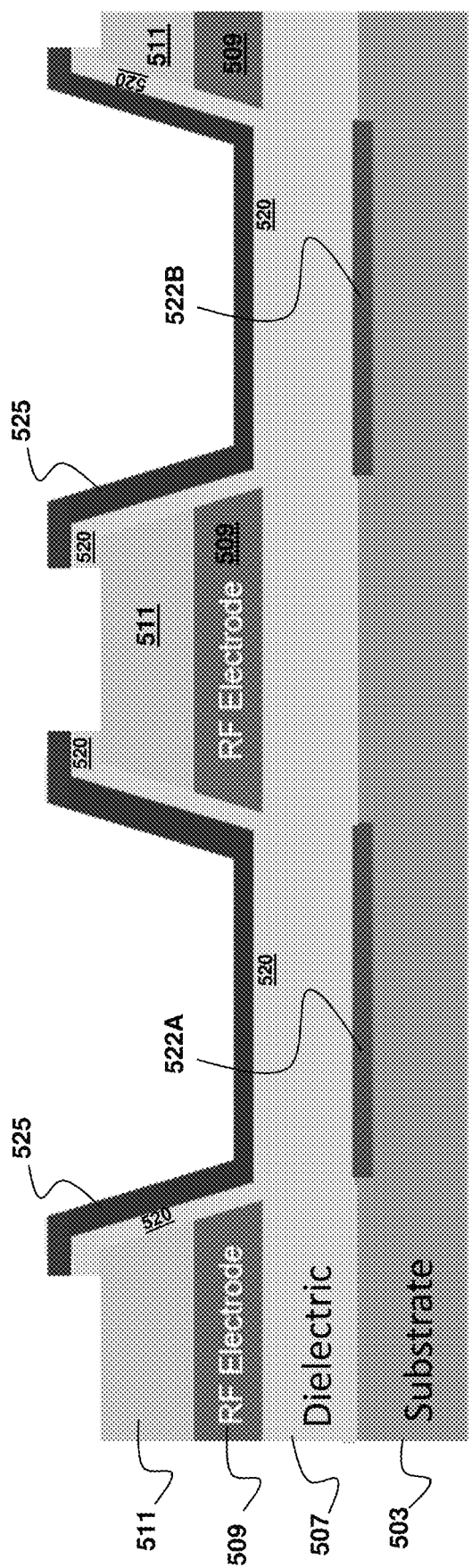

Further, FIG. 7 depicts the results of: (a) high-temperature anneal; (b) voltage tunable dielectric sputter (the voltage tunable dielectric sputter may comprise, for example, depositing layer 520 (which layer 520 may be, for example, the third dielectric layer and second voltage-tunable dielectric layer)); (c) upper bias layer deposition (see 525); and FIG. 8 depicts the results of (d) anneal and etch of the upper bias layer and third dielectric layer.

Figure 9:
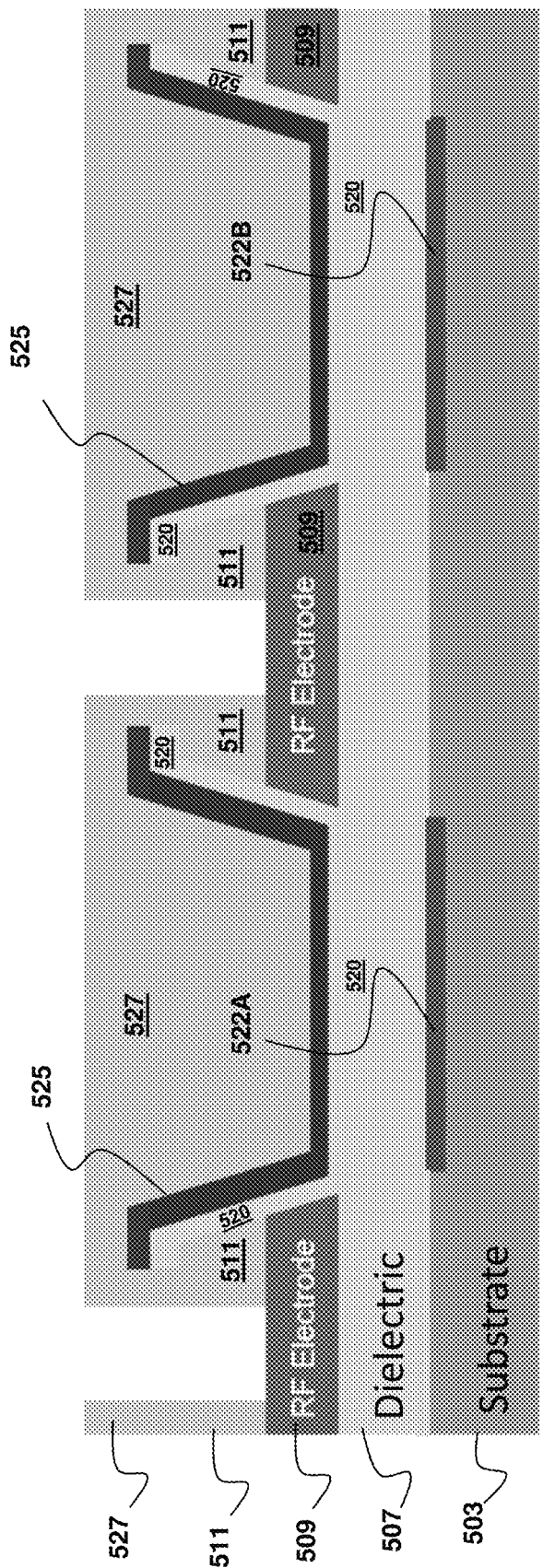

Further, FIG. 9 depicts the results of: (a) additional dielectric (usually SiO2) (see 527) deposition; and (b) Via etch.

Figure 10:
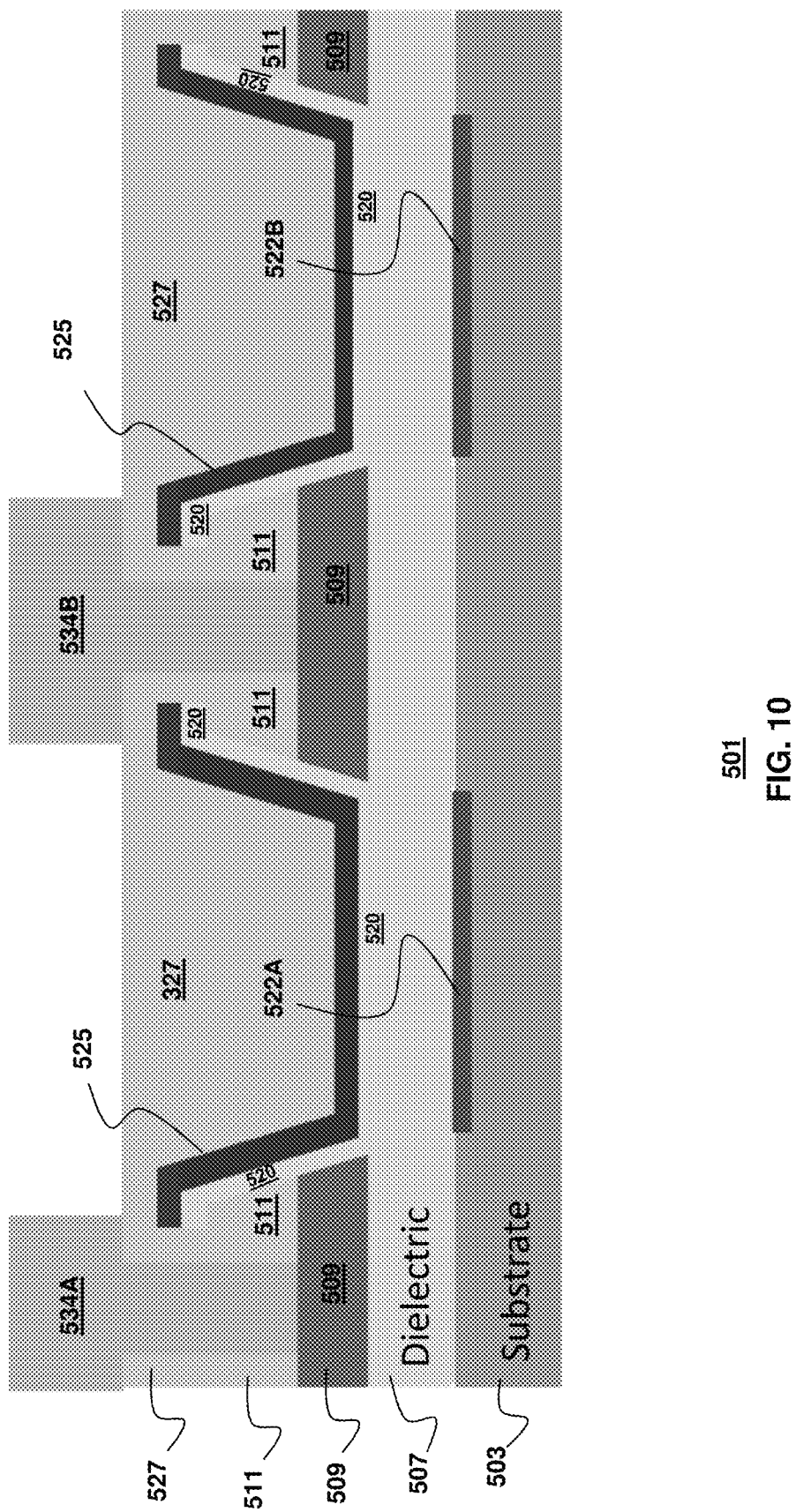

Further, FIG. 10 depicts the results of M1 deposition/etch (see 534A, 534B).

Figure 11:
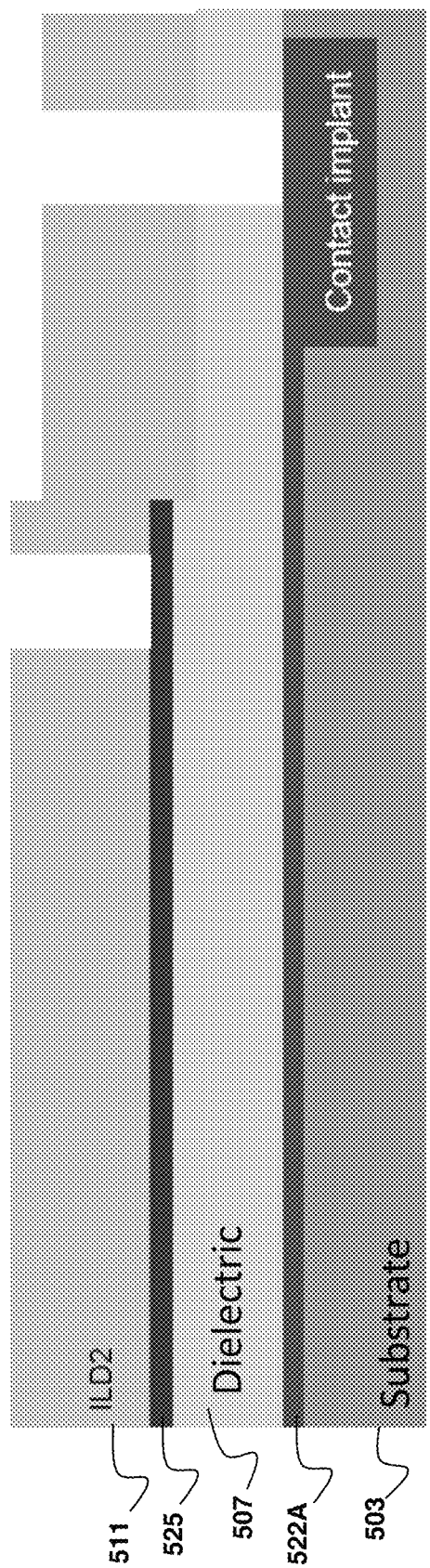
FIG. 11 depicts an illustrative embodiment related to manufacture of a tunable coplanar capacitor at the stage of the process shown in FIG. 9 (this FIG. 11 is a cross sectional view showing a section through the capacitor area between the RF electrodes)

Referring now to FIG. 11, this depicts an illustrative embodiment related to manufacture of a tunable coplanar capacitor at the stage of the process shown in FIG. 9 (this FIG. 11 is a cross sectional view showing a section through the capacitor area between the RF electrodes; further, in FIG. 11 each call out number refers to the same respective component (as modified throughout the process) that is shown in each of the figures of 5-10). In FIG. 11 a contact to the bias line 522A is provided by a second ion implantation step done directly after the bias line implant. One embodiment of this would be to strip the photoresist mask used for the bias line implant, form a second photoresist implant mask to expose a suitable area for the contact, and perform a second ion implantation of dopant atoms with a higher dose than the bias line implant. The two implants can then undergo the same thermal annealing step to activate the dopants.

Figure 12:
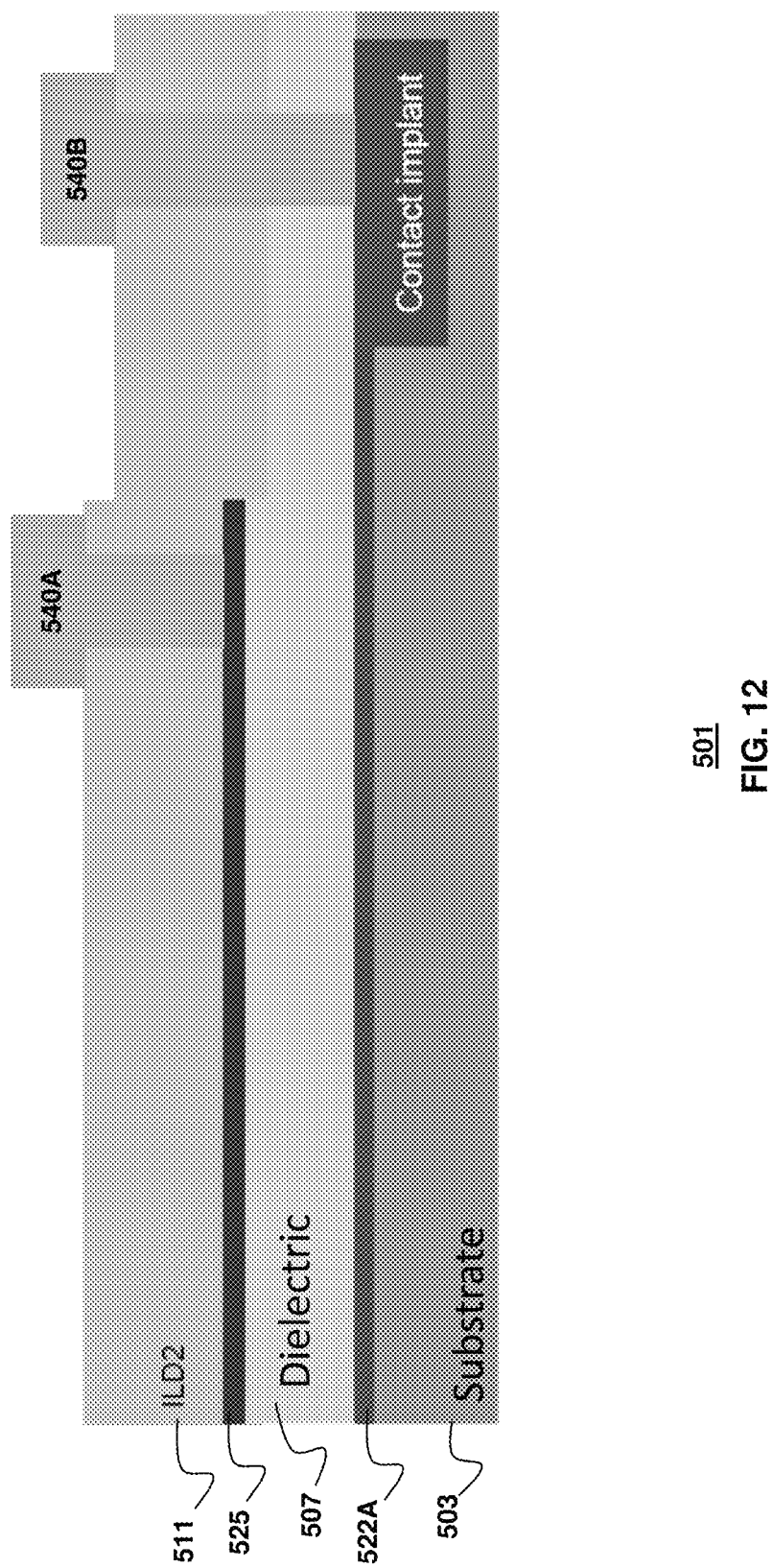
FIG. 12 depicts an illustrative embodiment related to manufacture of a tunable coplanar capacitor (this FIG. 12 is a cross sectional view showing a section through the capacitor area between the RF electrodes showing how to connect M1 to the SiCr (or ITO) and the implanted bias ground line).

Referring now to FIG. 12, this depicts an illustrative embodiment related to manufacture of a tunable coplanar capacitor (this FIG. 12 is a cross sectional view showing a section through the capacitor area between the RF electrodes). This FIG. 12 shows how to connect M1 (see 540A, 540B) to the SiCr (or ITO) and the implanted bias ground line). In particular, FIG. 12 shows the results of M1 deposition/etch (as well as detail on contact to the upper bias layer and implanted buried bias line). Further, it is noted that this area is passivated by the second ILD layer (see 511) deposited after the patterning of the upper bias layer.

Still referring to the embodiment utilizing a buried bias layer, it is noted that: (a) in this embodiment no implants are needed so no silicon or polysilicon layer is necessarily needed; (b) in this embodiment the buried bias layer can be grounded and the positive bias applied to the second bias layer on top; (c) in this embodiment the second bias layer, because it is insulated with (for example) the second voltage-tunable dielectric layer, must be a resistive material such as ITO (otherwise there might be a low-impedance path laterally through the material that would affect tuning, capacitance and Q-factor).

As described herein are various embodiments related to an isolated upper bias layer, self-aligned vertical bias coplanar capacitor.

As described herein are embodiments related to a tunable coplanar RF capacitor utilizing a parallel-plate tunable architecture.

As described herein, dielectric (e.g., BST) patterning can make the process much more flexible (e.g., a patterned lower electrode can increase flexibility as well as allow parallel-plate capacitors to be integrated with the lateral capacitors.

In various embodiments, the upper bias layer material may affect the Q and leakage.

In various specific examples, the upper bias layer can be SiCr, ITO (indium-tin-oxide) but it must, in these examples, have high resistivity.

In one embodiment, the lateral dielectric constant may be tuned with a vertical electric field.

In another embodiment, the vector of the piezoelectric coefficient may be perpendicular to the radio-frequency "RF" field—so there may be no electro-strictive resonance "ELSR" (ELSR is a voltage-induced piezoelectric coefficient in the BST that will resonate with the applied RF electric field and introduce losses at specific frequencies determined by the device structure and layer thicknesses).

In another embodiment, the device can be made wide for the improvement of linearity, increased power handling and reduced signal distortion.

In another embodiment, global or local alignment marks may be etched into the silicon at the time of implant. In one specific example, overlap between the buried implant and the electrodes (e.g., Pt electrodes) may optimally be minimized As described herein, an embodiment provides for an implant to be performed before a SiCr layer is deposited.

As described herein, various devices can operate at a relatively high frequency (e.g., 2-6 GHz range).

As described herein, various devices can be produced with high Q and/or high linearity (using, for example, a simpler process that results in cost savings).

In various embodiments, a metal layer (e.g. platinum layer) may be made thin).

In various specific examples, the dopant(s) can comprise: arsenic, phosphorus, boron, or any combination thereof.

As described herein, a device can be provided in which a vertical field can be controlled.

In various embodiments, a process is provided for forming a tunable coplanar capacitor, wherein the capacitor provides for vertical tuning and a lateral RF path. In one example, the structure can include self-aligned bias lines formed by ion implantation of dopants into the Si substrate utilizing high energy for the implant after the second dielectric and first metal layers are patterned.

As described herein, various embodiments can improve the linearity without compromising of Q-factor and tuning. In one example, high-frequency Q can be improved by elimination of electrostrictive resonance.

As described herein various embodiments provide a tunable RF capacitor comprising at least one layer of tunable dielectric sandwiched between lower and upper biasing DC electrodes and coplanar RF electrodes.

As described herein various embodiments provide a tunable RF capacitor wherein tuning bias is applied vertically (lower electrode to top electrode or vice versa) while RF is applied laterally.

As described herein, various embodiments provide a tunable RF capacitor that acts as a parallel plate capacitor for the tuning bias and acts as a coplanar capacitor for the RF field.

As described herein, various embodiments provide a tunable RF capacitor of the described structure wherein RF electrodes are metals or multilayer structures with high electric conductivity to minimize resistive RF losses.

As described herein, various embodiments provide a tunable RF capacitor of the described structure wherein RF electrodes are metals or multilayer structures using materials with low magnetic susceptibility to minimize inductive RF losses.

As described herein, various embodiments provide a tunable RF capacitor of the described structure wherein DC biasing electrodes (bias lines and upper bias layers) are highly resistive. In various examples, they could be semiconducting compounds, resistive compounds, silicides, intermetallics and/or metals with the electrical resistivity of one or more orders of magnitude higher than of the RF electrode materials. Various examples of
the resistive electrode materials (but not limited to) are: ITO (Indium Titanium Oxide), ZnO, IrOx, SRO (Strontium Ruthenium Oxide), TiN, TiOxNy, doped SiC or other silicides, and doped Si.

As described herein, various embodiments provide a tunable RF capacitor fabricated on the semiconductive or insulating RF substrate. Appropriate substrates could be, for example, low RF loss insulative (Sapphire, Alumina, MgO, etc.) or semiconducting with the RF-isolation layers (high-resistivity Si or SiC).

As described herein, various embodiments provide a tunable RF capacitor of the described structure wherein tunable dielectric is of perovskite, pyrochlore, and/or layered crystalline structure.

As described herein, various embodiments provide a tunable RF capacitor of the described structure wherein tunable dielectric is polycrystalline, nanocrystalline, nearly amorphous, and/or amorphous or epitaxial film of any crystalline habit and orientation.

As described herein, the RF electrodes can be formed from one or more of Pt, Al alloys, Al alloys combined with conductive barrier metals or alloys, gold, Ir, Ir oxides, SrRuO3, other conductive, resistive or semiconductive materials.

As described herein, integration of other microwave RF structures (such as coplanar waveguides, phase shifters, power splitters/combiners, mixers, etc.) together with the coplanar BST capacitors and/or parallel-plate capacitors can be provided.

As described herein, it can be advantageous during operation of the device for the applied RF electric field in the device to be orthogonal to the DC bias electric field.

In one specific example, a bias voltage can be determined by a thickness of the dielectric layer that is adjacent the substrate.

In one specific example, the dielectric layer that is adjacent the substrate can be annealed after implantation (e.g., after application of energy).

In one specific example, the device can be integrated with one or more resistors.

In another specific example, the bias lines can be formed by ion implantation of dopant atoms into a silicon substrate or layer.

In other examples, the plurality of bias lines can comprise dopant atoms implanted into the substrate. In various specific examples, ion implantation can be done at room temperature; afterward thermal annealing at high temperature (e.g., 800-1000C) can be used to activate the dopants. In other specific examples, the dopant can be boron. Boron is a P-type dopant in silicon so with a positive voltage bias the bias lines would be isolated from each other by back-to-back diodes (for a slightly N-type silicon substrate).

In other examples, the metal segment can comprise a first barrier layer, low-resistance metal, and an optional second barrier layer. In various specific examples, the barrier layer can comprise a titanium-tungsten alloy, titanium, titanium-nitride or material with similar functionality. In various specific examples, the low-resistance metal can comprise Al, Al alloy, gold, copper, silver or other, low-resistance metal. In various specific examples, the optional second barrier layer can comprise titanium-tungsten alloy, titanium-nitride or similar materials with barrier properties.

As described herein, the buried bias lines can be formed into a plane (e.g., a ground plane or a bias plane) and all connected together (that is, in such example, the structure would not have separated buried bias lines). In this example, the buried bias lines would then be grounded (and in one specific example, the bias lines would be on the top). In one specific example, the buried bias plane can be at DC ground. In another example, the "plurality of bias lines" can be, in effect, areas beneath the capacitors.

As described herein, in various embodiments the ILD/electrodes are patterned, bottom bias lines implanted and then the second BST layer is deposited to insulate the top bias lines from the RF electrodes.

As described herein, the voltage-tunable material can comprise one or more of a high-K ferroelectric material, such as (but not limited to) barium strontium titanate (BST), lead zirconate titanate (PZT), lead lanthanum zirconate titanate (PLZT), strontium bismuth tantalate (SBT), lithium niobate (LN), bismuth lanthanum titanate (BLT), and lead scandium titanate including doped compositions or solid solutions thereof. In order to achieve desired properties, such material can be a layered structure comprising one or more tunable dielectrics.

As described herein, in various embodiments, a thickness of the voltage-tunable dielectric (e.g., in a vertical direction) is smaller than a size (e.g., in a horizontal direction) of each of the plurality of first gaps.

In various embodiments, the bias lines are self-aligned to the gaps (e.g., the gaps in the first metal layer and the gaps in the second dielectric layer). In various specific examples, such self-alignment is a result of the masking, etching and implanting described herein.

Upon reviewing the aforementioned embodiments, it would be evident to an artisan with ordinary skill in the art that said embodiments can be modified, reduced, or enhanced without departing from the scope of the claims described below.

Other embodiments can be applied to the subject disclosure without departing from the scope of the claims described below.

In another embodiment, equipment for carrying out processes described herein can be computer controlled in a series of steps to produce the structures described herein.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, are contemplated by the subject disclosure.

The components and techniques described in U.S. application Ser. No. 14/642,222 filed Mar. 9, 2015 and U.S. application Ser. No. 15/184,081 filed Jun. 16, 2016 are hereby incorporated by reference herein in their entirety. These applications describe configurations and fabrication techniques, including particular deposition processes and parameters of those processes, that can be used with one or more of the exemplary embodiments described herein, including in addition to components or steps of the exemplary embodiments or in place of components or steps of the exemplary embodiments.

In one or more embodiments, a sputtering target can be selected or fabricated (and utilized in one or more of the exemplary embodiments) according to one or more of the features or process steps of U.S. Patent Publication No. 20140216921, the disclosure of which is hereby incorporated by reference.

One or more features and/or process steps described in U.S. Pat. Nos. 8,154,850, 8,693,162, 8,664,704, 5,745,335, U.S. Patent Publication No. 20140216921, and U.S. application Ser. No. 14/642,222 can be utilized in place of or in addition to one or more features and/or process steps described herein with respect to the exemplary embodiments. The disclosures of U.S. Pat. Nos. 8,154,850, 8,693, 162, 8,664,704, 5,745,335, U.S. Patent Publication No. 20140216921, and U.S. application Ser. No. 14/642,222 are incorporated herein by reference in their entirety.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A tunable coplanar capacitor, comprising:
a plurality of bias lines encapsulated between a substrate and a voltage-tunable dielectric, wherein the plurality of bias lines are spaced laterally apart;
a first metal layer over the voltage-tunable dielectric, wherein a plurality of first gaps are disposed in the first metal layer, and wherein each of the plurality of first gaps is located at least partially above a respective one of the plurality of bias lines;
an upper bias layer over the first metal layer, wherein each of a plurality of portions of the upper bias layer extends through a respective one of the plurality of first gaps in the first metal layer to come into contact with the voltage-tunable dielectric, and wherein at least a second gap is disposed in the upper bias layer; and
a second metal layer, wherein a portion of the second metal layer extends through the second gap in the upper bias layer to come into contact with the first metal layer.

2. The tunable coplanar capacitor of claim 1, wherein a thickness of the voltage-tunable dielectric is smaller than a size of each of the plurality of first gaps.

3. The tunable coplanar capacitor of claim 1, wherein, when the tunable coplanar capacitor is in operation, an RF electric field and a DC biasing electric field are perpendicular and the DC biasing electric field is applied across a thickness of the voltage-tunable dielectric.

4. The tunable coplanar capacitor of claim 1, wherein the plurality of bias lines comprise dopant atoms implanted into the substrate.

5. The tunable coplanar capacitor of claim 1, wherein a sheet resistance of the bias lines is at least two orders of magnitude higher than that of an impedance of the tunable coplanar capacitor between RF electrodes formed from the first metal layer at a frequency of operation of the tunable coplanar capacitor.

6. The tunable coplanar capacitor of claim 1, wherein:
the substrate comprises silicon or another semiconducting substrate, polysilicon on an insulating substrate, or a combination thereof;
the voltage-tunable dielectric comprises BST, BT, PZT, SBN, PLZT, their doped compositions, or multilayer structures thereof;
the first metal layer comprises platinum, iridium, ruthenium, osmium including their alloys and multilayer structures;
the upper bias layer comprises SiCr, ITO, IrOx, SRO or other electrically conductive resistive metals, alloys or oxides; and
the second metal layer comprises a metal diffusion barrier layer, aluminum, aluminum alloy, gold or other low-resistivity metallization.

7. The tunable coplanar capacitor of claim 1, further comprising another dielectric between the upper bias layer and the second metal layer.

8. The tunable coplanar capacitor of claim 7, wherein the another dielectric has a third gap located at least partially over the second gap in the upper bias layer and wherein the portion of the second metal layer extends through the third gap in the another dielectric and extends through the second gap in the upper bias layer to come into contact with the first metal layer.

9. The tunable coplanar capacitor of claim 8, wherein:
the second gap in the upper bias layer comprises a plurality of second gaps in the upper bias layer;
the third gap in the another dielectric comprises a plurality of third gaps in the another dielectric; and
each of the plurality of third gaps in the another dielectric is located at least partially over a respective one of each of the plurality of second gaps in the upper bias layer.

10. The tunable coplanar capacitor of claim 9, wherein:
the portion of the second metal layer comprises a plurality of portions of the second metal layer; and
each of the plurality of portions of the second metal layer extends through a respective one of the plurality of second gaps in the upper bias layer and through a respective one of the plurality of third gaps in the another dielectric to come into contact with the first metal layer.

11. The tunable coplanar capacitor of claim 1, further comprising another dielectric between the upper bias layer and the first metal layer.

12. The tunable coplanar capacitor of claim 11, wherein the another dielectric has a third gap located at least partially under the second gap in the upper bias layer and wherein the portion of the second metal layer extends through the third gap in the another dielectric and extends through the second gap in the upper bias layer to come into contact with the first metal layer.

13. The tunable coplanar capacitor of claim 12, wherein:
the second gap in the upper bias layer comprises a plurality of second gaps in the upper bias layer;
the third gap in the another dielectric comprises a plurality of third gaps in the another dielectric; and
each of the plurality of third gaps in the another dielectric is located at least partially under a respective one of each of the plurality of second gaps in the upper bias layer.

14. The tunable coplanar capacitor of claim 13, wherein:
the portion of the second metal layer comprises a plurality of portions of the second metal layer; and
each of the plurality of portions of the second metal layer extends through a respective one of the plurality of second gaps in the upper bias layer and through a respective one of the plurality of third gaps in the another dielectric to come into contact with the first metal layer.

15. A tunable coplanar capacitor, comprising:
a plurality of bias lines encapsulated between a substrate and a voltage-tunable dielectric layer, wherein the plurality of bias lines are spaced apart;
a first metal layer above the voltage-tunable dielectric layer, wherein a plurality of first gaps are located in the first metal layer, each of the plurality of first gaps being located at least partially above a respective one of the plurality of bias lines;

an upper bias layer above the first metal layer, wherein each of a plurality of portions of the upper bias layer extends through a respective one of the plurality of first gaps in the first metal layer to come into contact with the voltage-tunable dielectric layer, and wherein at least a second gap is located in the upper bias layer; and a second metal layer, a portion of the second metal layer extending through the second gap in the upper bias layer to come into contact with the first metal layer;

wherein a thickness of the voltage-tunable dielectric layer is smaller than a size of each of the plurality of first gaps; and wherein, when the tunable coplanar capacitor is in operation, an RF electric field and a DC biasing electric field are perpendicular and the DC biasing electric field is applied across the thickness of the voltage-tunable dielectric layer.

16. The tunable coplanar capacitor of claim 15, wherein the plurality of bias lines comprise dopant atoms implanted into the substrate.

17. The tunable coplanar capacitor of claim 15, wherein:
the substrate comprises silicon or another semiconducting substrate, polysilicon on an insulating substrate, or a combination thereof;
the voltage-tunable dielectric layer comprises BST, BT, PZT, SBN, PLZT, their doped compositions, or multilayer structures thereof;
the first metal layer comprises platinum, iridium, ruthenium, osmium including their alloys and multilayer structures;
the upper bias layer comprises SiCr, ITO, IrOx, SRO or other electrically conductive resistive metals, alloys or oxides; and
the second metal layer comprises a metal diffusion barrier layer, aluminum, aluminum alloy, gold or other low-resistivity metallization.

18. A tunable coplanar capacitor, comprising:
a substrate;
a layer of voltage-tunable dielectric over the substrate;
a plurality of bias lines encapsulated between the substrate and the voltage-tunable dielectric, wherein the plurality of bias lines are spaced laterally apart;
a first metal layer over the voltage-tunable dielectric, wherein a plurality of first gaps are disposed in the first metal layer, and wherein each of the plurality of first gaps is located at least partially above a respective one of the plurality of bias lines;

an upper bias layer over the first metal layer, wherein each of a plurality of portions of the upper bias layer extends through a respective one of the plurality of first gaps in the first metal layer to come into contact with the voltage-tunable dielectric, and wherein at least a second gap is disposed in the upper bias layer; and a second metal layer, wherein a portion of the second metal layer extends through the second gap in the upper bias layer to come into contact with the first metal layer;

wherein a thickness of the voltage-tunable dielectric is smaller than a size of each of the plurality of first gaps; and wherein, when the tunable coplanar capacitor is in operation, an RF electric field and a DC biasing electric field are perpendicular and the DC biasing electric field is applied across the thickness of the voltage-tunable dielectric.

19. The tunable coplanar capacitor of claim 18, wherein:
the plurality of bias lines comprise dopant atoms implanted into the substrate; and
a sheet resistance of the bias lines is at least two orders of magnitude higher than that of an impedance of the tunable coplanar capacitor between RF electrodes formed from the first metal layer at a frequency of operation of the tunable coplanar capacitor.

20. The tunable coplanar capacitor of claim 18, wherein:
the substrate comprises silicon or another semiconducting substrate, polysilicon on an insulating substrate, or a combination thereof;
the voltage-tunable dielectric comprises BST, BT, PZT, SBN, PLZT, their doped compositions, or multilayer structures thereof;
the first metal layer comprises platinum, iridium, ruthenium, osmium including their alloys and multilayer structures;
the upper bias layer comprises SiCr, ITO, IrOx, SRO or other electrically conductive resistive metals, alloys or oxides; and
the second metal layer comprises a metal diffusion barrier layer, aluminum, aluminum alloy, gold or other low-resistivity metallization.

* * * * *